(12) United States Patent
Tanimoto

(10) Patent No.: US 10,498,293 B2
(45) Date of Patent: *Dec. 3, 2019

(54) POWER AMPLIFICATION APPARATUS AND TELEVISION SIGNAL TRANSMISSION SYSTEM

(71) Applicant: NEC CORPORATION, Tokyo (JP)

(72) Inventor: Takuya Tanimoto, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/237,196

(22) Filed: Dec. 31, 2018

(65) Prior Publication Data

US 2019/0140599 A1    May 9, 2019

Related U.S. Application Data

(62) Division of application No. 15/744,561, filed as application No. PCT/JP2015/004447 on Sep. 1, 2015, now Pat. No. 10,361,661.

(51) Int. Cl.
*H03F 1/02* (2006.01)
*H03F 1/07* (2006.01)
(Continued)

(52) U.S. Cl.
CPC ............ *H03F 1/0288* (2013.01); *H03F 1/07* (2013.01); *H03F 3/193* (2013.01); *H03F 3/211* (2013.01); *H04B 1/03* (2013.01); *H04N 5/38* (2013.01); *H03F 2200/405* (2013.01); *H03F 2203/21142* (2013.01)

(58) Field of Classification Search
CPC ........ H03F 1/0288; H03F 3/193; H03F 3/211; H04N 5/38
See application file for complete search history.

(56) References Cited

U.S. PATENT DOCUMENTS 3,717,813 A    2/1973  Lieberman et al.
5,982,252 A    11/1999 Werlau
(Continued)

FOREIGN PATENT DOCUMENTS

EP    00200884 A2   12/1986
JP    1172722 U    12/1989
(Continued)

OTHER PUBLICATIONS

Communication dated Feb. 5, 2019 from the Japanese Patent Office in application No. 2018-076705.
(Continued)

*Primary Examiner* — Brian P Yenke
(74) *Attorney, Agent, or Firm* — Sughrue Mion, PLLC

(57) ABSTRACT

An amplification unit contains two or more sets containing a plurality of amplification circuits, and amplifies power of an RF (Radio Frequency) signal. A combining unit contains two or more combiners corresponding to the two or more sets, combines RF signals output by the amplification circuits, and outputs a resultant RF signal. The amplification unit has one chassis storing each amplification circuit. The amplification unit and the combining unit have two or more connectors which are arranged transversely. The amplification unit and the combining unit are attachable/detachable.

7 Claims, 15 Drawing Sheets

(51) Int. Cl.
*H03F 3/193* (2006.01)
*H03F 3/21* (2006.01)
*H04B 1/03* (2006.01)
*H04N 5/38* (2006.01)

(56) References Cited

U.S. PATENT DOCUMENTS

| | | | |
|---|---|---|---|
| 6,798,295 B2 | 9/2004 | Pengelly et al. | |
| 8,018,276 B2 | 9/2011 | Ibrahim et al. | |
| 8,928,402 B2 | 1/2015 | Gajadharsing | |
| 9,166,537 B2 | 10/2015 | Schmidt | |
| 9,312,817 B2 | 4/2016 | Aaen et al. | |
| 9,325,280 B2 | 4/2016 | Blednov et al. | |
| 9,419,566 B2 | 8/2016 | Noori et al. | |
| 9,531,327 B2 | 12/2016 | Kunihiro | |
| 9,667,198 B2 | 5/2017 | Yoshikawa | |
| 9,667,199 B1 | 5/2017 | McLaren | |
| 9,673,761 B2 | 6/2017 | Otake | |
| 9,780,731 B2 | 10/2017 | Volokhine et al. | |
| 9,787,253 B2 | 10/2017 | Tanimoto | |
| 9,831,857 B2 | 11/2017 | Facchini et al. | |
| 9,847,761 B2 | 12/2017 | Yamanouchi et al. | |
| 9,917,551 B2 | 3/2018 | McLaren | |
| 2001/0003433 A1* | 6/2001 | Hu | H03F 1/52 330/132 |
| 2001/0017570 A1* | 8/2001 | Sera | H03F 1/3229 330/149 |
| 2003/0107453 A1 | 6/2003 | Kenington | |
| 2003/0223209 A1 | 12/2003 | Lee | |
| 2008/0182535 A1* | 7/2008 | Choi | H04B 15/06 455/192.1 |
| 2008/0231359 A1 | 9/2008 | Tanimoto | |
| 2009/0039964 A1* | 2/2009 | Hijikata | H03F 1/0205 330/305 |
| 2011/0149526 A1* | 6/2011 | Turner | H05K 7/207 361/730 |
| 2012/0112833 A1* | 5/2012 | Jeong | H03F 1/0288 330/124 R |
| 2012/0235734 A1 | 9/2012 | Pengelly | |
| 2013/0196714 A1 | 8/2013 | Yin et al. | |
| 2013/0241639 A1 | 9/2013 | Wilson et al. | |
| 2014/0062589 A1 | 3/2014 | Schenck | |
| 2014/0118072 A1 | 5/2014 | Briffa et al. | |
| 2015/0170986 A1 | 6/2015 | Szymanowski et al. | |
| 2015/0229282 A1 | 8/2015 | Kaehs et al. | |
| 2015/0263678 A1 | 9/2015 | Kunihiro | |
| 2015/0318828 A1 | 11/2015 | Stempfl et al. | |
| 2015/0333706 A1 | 11/2015 | Blednov | |
| 2016/0013762 A1 | 1/2016 | Sun et al. | |
| 2016/0065141 A1 | 3/2016 | Yoshikawa | |
| 2016/0142022 A1 | 5/2016 | Wang et al. | |
| 2016/0190997 A1 | 6/2016 | Tanimoto | |
| 2016/0191003 A1 | 6/2016 | Yamanouchi et al. | |
| 2016/0197584 A1 | 7/2016 | Tanimoto | |
| 2016/0248383 A1 | 8/2016 | Otake | |
| 2017/0026001 A1 | 1/2017 | Moronval et al. | |
| 2017/0359032 A1 | 12/2017 | McLaren | |
| 2018/0019711 A1 | 1/2018 | Wang et al. | |
| 2018/0076773 A1 | 3/2018 | Lloyd | |
| 2018/0145646 A1 | 5/2018 | Tanimoto | |
| 2019/0181892 A1* | 6/2019 | Takenaka | H04B 1/04 |

FOREIGN PATENT DOCUMENTS

| | | |
|---|---|---|
| JP | 09-200105 A | 7/1997 |
| JP | 09261083 A | 10/1997 |
| JP | 10270958 A | 10/1998 |
| JP | 11-041117 A | 2/1999 |
| JP | 11-62560 A | 6/1999 |
| JP | 2001-223542 A | 8/2001 |
| JP | 2003110273 A | 4/2003 |
| JP | 2004-140445 A | 5/2004 |
| JP | 2007-173955 A | 7/2007 |
| JP | 2009273134 A | 11/2009 |
| JP | 2012-100020 A | 5/2012 |
| WO | 2014/155512 A1 | 10/2014 |

OTHER PUBLICATIONS

Communication dated Aug. 17, 2018, from the European Patent Office in counterpart application No. 15902888.5.
Communication dated Apr. 11, 2018 from the Australian Patent Office in counterpart application No. 2015407553.
International Search Report for PCT/JP2015/004447 dated Oct. 6, 2015 [PCT/ISA/210].
Written Opinion for PCT/JP2015/004447 dated Oct. 6, 2015 [PCT/ISA/237].
International Preliminary Report on Patentability for PCT/JP2015/004447 dated Apr. 20, 2017 [PCT/ISA/409].
Communication dated Aug. 20, 2019, from the Japanese Patent Office in counterpart application No. 2018-076705.

* cited by examiner

POWER AMPLIFICATION APPARATUS AND TELEVISION SIGNAL TRANSMISSION SYSTEM

CROSS REFERENCE TO RELATED APPLICATIONS

This application is a Divisional of U.S. patent application Ser. No. 15/744,561, filed on Jan. 12, 2018, which is a National Stage of International Application No. PCT/JP2015/004447, filed on Sep. 1, 2015, the contents of all of which are incorporated herein by reference in their entirety.

TECHNICAL FIELD

The present invention relates to a power amplification apparatus amplifying the power of RF (Radio Frequency) signals and a television signal transmission system having such a power amplification apparatus.

BACKGROUND ART

Patent Document 1 describes a power amplifier for use in power amplification of RF signals. The power amplifier described in Patent Document 1 is provided with a plurality of sets of a first amplification unit and a second amplification unit, in which a Doherty combiner is provided in each set. Furthermore, the power amplifier described in Patent Document 1 is provided with a broadband combiner combining output signals of the Doherty combiners. In a first amplification unit, a plurality of amplification circuits operating in Class AB or Class B is provided in parallel and a combiner combining output signals of the amplification circuits is further provided. In a second amplification unit, a plurality of amplification circuits operating in Class C is provided in parallel and a combiner combining output signals of the amplification circuits is further provided. In the power amplifier described in Patent Document 1, each first amplification unit, each second amplification unit, each Doherty combiner, and the broadband combiner are stored in a different chassis and the Doherty combiner can be exchanged.

In the power amplifier described in Patent Document 1, the first amplification units and the second amplification units are arranged in the vertical direction as illustrated in FIG. 5 of Patent Document 1. In the Doherty combiner corresponding to the set of the first amplification unit and the second amplification unit, two input connectors into which RF signals are input are disposed in such a manner as to be arranged in the longitudinal direction. The first amplification unit and the second amplification unit each have one output connector. The output connector of the first amplification unit disposed on the upper side is connected to the input connector on the upper side in the Doherty combiner and the output connector of the second amplification unit disposed on the lower side is connected to the input connector on the lower side in the Doherty combiner.

Patent Document 2 describes a solidified shortwave band transmission system of several tens of kW class. The solidified shortwave band transmission system described in Patent Document 2 has a combining unit containing a plurality of pre-combiner and one post-combiner. Moreover, a plurality of power amplifiers which can be individually detached and attached is provided in each pre-combiner. Each pre-combiner combines outputs of the plurality of power amplifiers and the post-combiner combines outputs of the plurality of pre-combiners.

Patent Document 3 describes a configuration in which a plurality of amplification units is disposed between a distributor and a combiner. The amplification unit described in Patent Document 3 is one obtained by integrating a plurality (for example, 8) of individual selection amplifiers as one unit. When an individual selection amplifier is added, the individual selection amplifier is added in terms of amplification unit.

Patent Document 4 describes a power combining apparatus having a plurality of band pass filters having mutually different pass bands and one or two or more circulators. The power combining apparatus described in Patent Document 4 has a configuration in which a first band pass filter and a second band pass filter are connected with a first circulator and an n-th (n is natural number.) circulator and an n+2-th band pass filter are successively connected through with an n+1-th circulator.

A television broadcasting organization obtains approval of undertaking the broadcasting industry by transmitting television signals using the frequency band obtained by dividing the UHF (Ultra High Frequency) band (470 to 862 MHz) or the VHF (Very High Frequency) band (170 to 230 MHz) by a fixed bandwidth as the unit. For example, a broadcasting organization using the UHF band obtains approval of undertaking the broadcasting industry using the frequency band obtained by dividing the UHF band by a 8 MHz bandwidth as the unit. Depending on countries, the bandwidth dividing the UHF band is sometimes 6 MHz or 7 MHz.

CITATION LIST

Patent Literature

PTL 1: International Publication No. WO2014/155512
PTL 2: Japanese Unexamined Patent Publication Application No. 11-41117
PTL 3: Japanese Unexamined Patent Publication Application No. 9-200105
PTL 4: Japanese Unexamined Patent Publication Application No. 2004-140445

SUMMARY OF INVENTION

Technical Problem

As an example of the configuration of a common power amplification apparatus for use in a television signal transmission system, the configuration illustrated in FIG. 17 is considered. A common power amplification apparatus 90 illustrated in FIG. 17 is an integrated apparatus having a plurality of amplification circuits 91, a plurality of pre-combiners 92, and a post-combiner 93. FIG. 17 illustrates a case where six amplification circuits 91 and two pre-combiners 92 are provided. To each pre-combiner 92, three amplification circuits 91 are connected. Each amplification circuit 91 amplifies the power of an RF signal to be input, and then outputs the resultant RF signal to the pre-combiners 92. Each pre-combiner 92 combines RF signals output by the three amplification circuits 91, and then outputs the resultant signal to the post-combiner 93. The post-combiner 93 combines the RF signals output by the two pre-combiners 92, and then outputs the resultant RF signal to a device on the latter stage (which is not illustrated in FIG. 17) of the power amplification apparatus 90. The RF signal is a signal to be transmitted as a television signal.

The power amplification apparatus 90 illustrated in FIG. 17 combines RF signals output from the plurality of amplification circuits 91, and then outputs the resultant RF signal. Therefore, the number of an output end 94 of the RF signals is one. In the power amplification apparatus 90 illustrated in FIG. 17, the pre-combiners 92 and the post-combiner 93 are disposed in the center, and the signal output end of each amplification circuit 91 is directed to the center side (pre-combiner 92 side) of the power amplification apparatus 90. Therefore, the direction of the signal output end of each amplification circuit 91 and the direction of the output end 94 of the power amplification apparatus 90 are different from each other.

Each amplification circuit 91 amplifies the power of broadband RF signals. For example, each amplification circuit 91 is an amplification circuit usable for the entire UHF band or the entire VHF band. On the other hand, in the power amplification apparatus 90, the component (particularly pre-combiner 92) for the combination of RF signals combines RF signals of a specific frequency band. More specifically, the component (particularly pre-combiner 92) for the signal combination in the power amplification apparatus 90 combines RF signals of a frequency band for which a broadcasting organization has obtained approval.

A manufacturer manufacturing the power amplification apparatus 90 manufactures the power amplification apparatus 90 for each broadcasting organization according to the frequency band for which a broadcasting organization has obtained approval. However, the amplification circuit 91 amplifies the power of broadband RF signals, and therefore it is preferable for a manufacturer that the component (group of amplification circuits 91) for the power amplification of RF signals of the power amplification apparatus 90 can be manufactured in a standardized manner irrespective of broadcasting organizations, and then can provided to each broadcasting organization.

Moreover, a broadcasting organization obtains approval of the broadcasting industry for a plurality of kinds of frequency bands in some cases. In this case, the broadcasting organization uses the power amplification apparatus 90 illustrated in FIG. 17 for each frequency band for which a broadcasting organization has obtained approval. The common power amplification apparatus 90 illustrated in FIG. 17 is an integrated apparatus. Therefore, when the amplification circuit 91 breaks down, the entire power amplification apparatus 90 needs to be exchanged. When it is supposed that the component (set of amplification circuits 91) for the power amplification of RF signals of the power amplification apparatus 90 is standardized irrespective of broadcasting organizations, and is separable from the component for signal combination, even when the amplification circuit 91 of any power amplification apparatus 90 among a plurality of kinds of the power amplification apparatus 90 breaks down, only a portion equivalent to the component for power amplification may be exchanged. However, the common power amplification apparatus 90 illustrated in FIG. 17 is an integrated apparatus, and therefore it is impossible to exchange only a portion equivalent to the component about power amplification.

Furthermore, even when the component for signal combination breaks down, it is impossible to exchange only a portion equivalent to the component for a signal combination in the integrated power amplification apparatus 90 illustrated in FIG. 17.

Therefore, when a portion equivalent to the component (set of amplification circuits 91) for power amplification of RF signals of the power amplification apparatus 90 can be standardized, so that the component (set of amplification circuits 91) for power amplification and the component for signal combination can be separately manufactured, it is preferable also for manufacturers of a power amplification apparatus and also for broadcasting organizations obtaining approval of the broadcasting industry of a plurality of kinds of frequency bands.

Moreover, in the power amplifier described in Patent Document 1, the output connector of the first amplification unit disposed on the upper side is connected to the input connector on the upper side in the Doherty combiner and the output connector of the second amplification unit disposed on the lower side is connected to the input connector on the lower side the Doherty combiner as described above (refer to FIG. 5 of Patent Document 1). The first amplification unit, the second amplification unit, the Doherty combiner, and the like described in Patent Document 1 are accommodated in a rack. Since a device on the latter stage side is generally accommodated in a deep side of the rack, the Doherty combiner is accommodated in the deep side of the rack and the first amplification unit and the second amplification unit are accommodated on the front side of the rack. Then, when the Doherty combiner breaks down, the Doherty combiner cannot be taken out from the rack only by removing only one of the first amplification unit on the upper stage and the second amplification unit on the lower stage from the Doherty combiner. In order to take out the Doherty combiner from the rack, there is a necessity of removing both the first amplification unit and the second amplification unit from the Doherty combiner. In order to facilitate the exchange of the broken Doherty combiner, it is preferable that the Doherty combiner can be taken out only by removing one device.

Then, it is an object of the present invention to provide a power amplification apparatus which enables separation of a component for power amplification of RF signals and a component for combination of RF signals and enables easy exchange of a component for combination of RF signals and a television signal transmission system having the power amplification apparatus.

Solution to Problem

A power amplification apparatus according to the present invention has an amplification unit containing at least one set containing a predetermined number of amplification circuits amplifying the power of an RF (Radio Frequency) signal and a combining unit containing a combiner provided corresponding to the set and combining RF signals output by the amplification circuits belonging to the corresponding set, and then outputting the resultant RF signal, in which the amplification unit has an output connector for outputting the RF signal output by the amplification circuit for each amplification circuit, the output connectors are arranged in the horizontal direction, the combining unit has an input connector into which the RF signal output from the output connector of the amplification unit is input for each output connector, the input connectors are arranged in the horizontal direction, the amplification unit and the combining unit are attachable/detachable through the output connectors and the input connectors, and the surface on which the input connectors are provided of the combining unit is set within the dimension of the surface on which the output connectors are provided of the amplification unit.

A television signal transmission system according to the present invention has the above-described power amplification apparatus.

Advantageous Effects of Invention

According to the present invention, a component for power amplification of RF signals and a component for combination of RF signals can be separated from each other, so that the component for combination of RF signals can be easily exchanged.

DESCRIPTION OF EMBODIMENT

Hereinafter, embodiments of the present invention are described with reference to the drawings.

Embodiment 1

Figure 1:
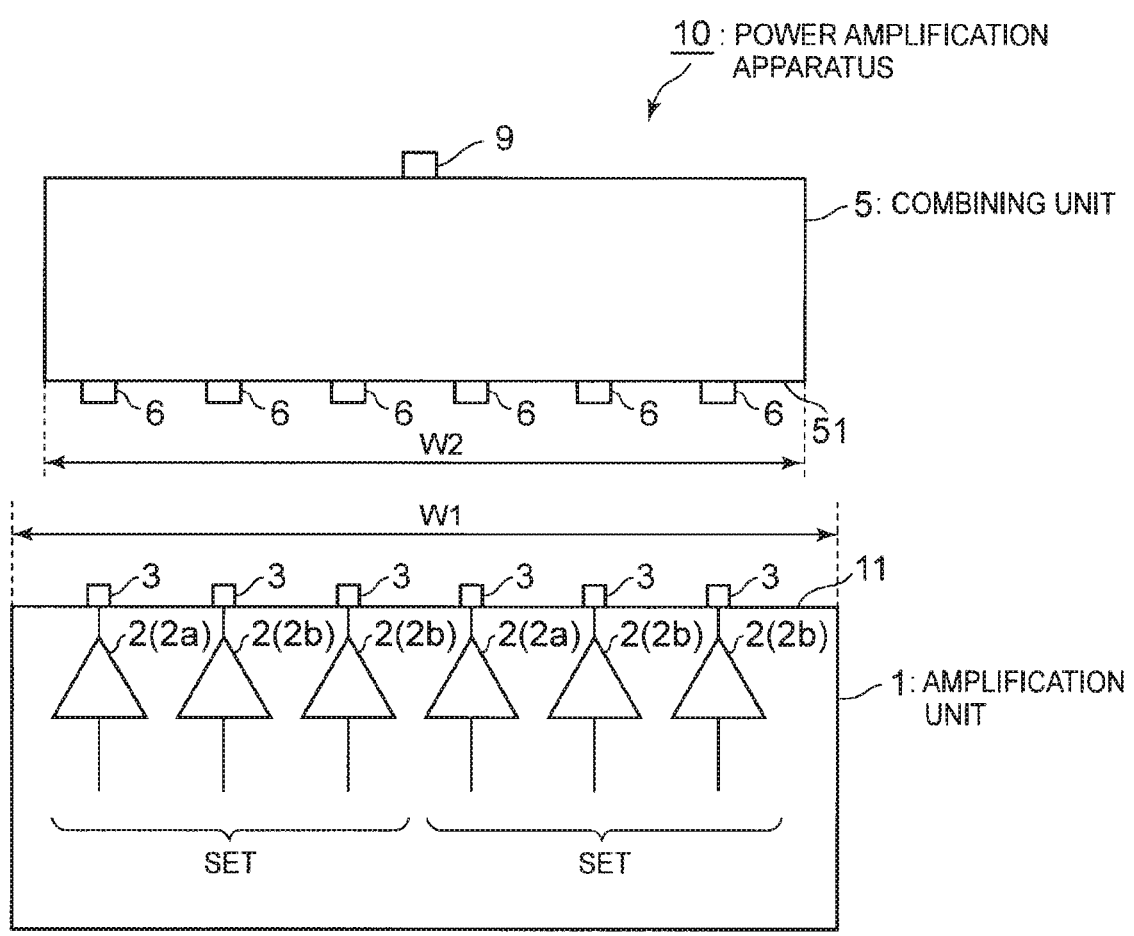
FIG. 1 is a schematic view illustrating an example of a power amplification apparatus of a first embodiment of the present invention.

FIG. 1 is a schematic view illustrating an example of a power amplification apparatus of a first embodiment of the present invention. The power amplification apparatus 10 of this embodiment has an amplification unit 1 and a combining unit 5. FIG. 1 illustrates a state where the amplification unit 1 and the combining unit 5 are not connected The amplification unit 1 has a plurality of amplification circuits 2. FIG. 1 is a top view and schematically illustrates the arrangement positions of the amplification circuits 2 in the amplification unit 1 when the power amplification apparatus 10 is viewed from above. However, each amplification circuit 2 is stored in a chassis of the amplification unit 1 and cannot be seen from the outside in actual.

In the amplification unit 1, at least one set containing a predetermined number of amplification circuits 2 is provided. The first embodiment describes a case where a plurality of sets of the amplification circuits 2 is provided. FIG. 1 illustrates a case where three amplification circuits 2 are set as one set and two sets of the amplification circuits 2 are provided. The number of the sets of the amplification circuits 2 provided in the amplification unit 1 may be three or more.

Each amplification circuit 2 amplifies the power of an input RF signal, and then outputs the RF signal after power amplification. The RF signal is a signal transmitted as a television signal.

Each amplification circuit 2 is realized by an FET (Field Effect Transistor), for example. Hereinafter, a description is given taking a case where each amplification circuit 2 is realized by an FET as an example.

The amplification unit 1 has an output connector 3 for outputting an RF signal output by the amplification circuit 2 for each amplification circuit 2. Therefore, the amplification circuits 2 and the output connectors 3 are in one-to-one correspondence. The output connectors 3 are disposed so as to be arranged in the horizontal direction on a side surface 11 facing the combining unit 5 among the side surfaces of the amplification unit 1. The amplification circuits 2 are disposed so that the signal output end of the amplification circuit 2 faces the corresponding output connector 3. Then, each output connector 3 is connected to the signal output end of the corresponding amplification circuit 2 and outputs an RF signal output by the corresponding amplification circuit 2 as it is. Accordingly, when focusing on one arbitrary output connector 3, the output connector 3 outputs an RF signal output by the corresponding one amplification circuit 2 as it is. Therefore, a circuit combining the RF signals output by the amplification circuits 2 is not contained in the amplification unit 1.

Moreover, the combining unit 5 has an input connector 6 into which an RF signal output from the output connector 3 is input for each output connector 3. Therefore, the output connectors 3 of the amplification unit 1 and the input connectors 6 of the combining unit 5 are in one-to-one correspondence. Accordingly, it can be said that the amplification circuits 2 and the input connectors 6 are also in one-to-one correspondence. The input connectors 6 are disposed so as to be arranged in the horizontal direction on a side surface 51 facing the amplification unit 1 among the side surfaces of the combining unit 5.

The output connectors 3 arranged in the horizontal direction in the amplification unit 1 and the input connectors 6 arranged in the horizontal direction in the combining unit 5 are disposed so that output connectors 3 and the input connectors 6 corresponding to each other are simultaneously connected to each other. For example, the output connectors 3 and the input connectors 6 are disposed so that the interval between the central axes of the output connectors 3 adjacent to each other and the interval between the central axes of the input connector 6 adjacent to each other are equal to each other.

Therefore, the amplification unit 1 and the combining unit 5 are attachable/detachable through the output connectors 3 and the input connectors 6. By simultaneously connecting the output connectors 3 and the input connectors 6 corresponding to each other, the amplification unit 1 and the combining unit 5 are brought into a connection state. In the example illustrated in FIG. 1, the amplification unit 1 and the combining unit 5 are brought into a connection state by simultaneously connecting six output connectors 3 and six input connectors 6.

Each input connector 6 is a floating connector.

The output connectors 3 and the input connectors 6 are coaxial connectors. In the state where the output connectors 3 and the input connectors 6 are connected to each other, RF signals output by the amplification circuits 2 are input into the combining unit 5 through the output connectors 3 and the input connectors 6. The combining unit 5 combines the RF signals input from the input connectors 6, and then outputs the RF signal after the combination from the output end 9. The output end 9 is provided on the side surface opposite to the side surface 51 on which the input connectors 6 are disposed in the combining unit 5. The configuration of the combining unit 5 is described later.

Figure 2:
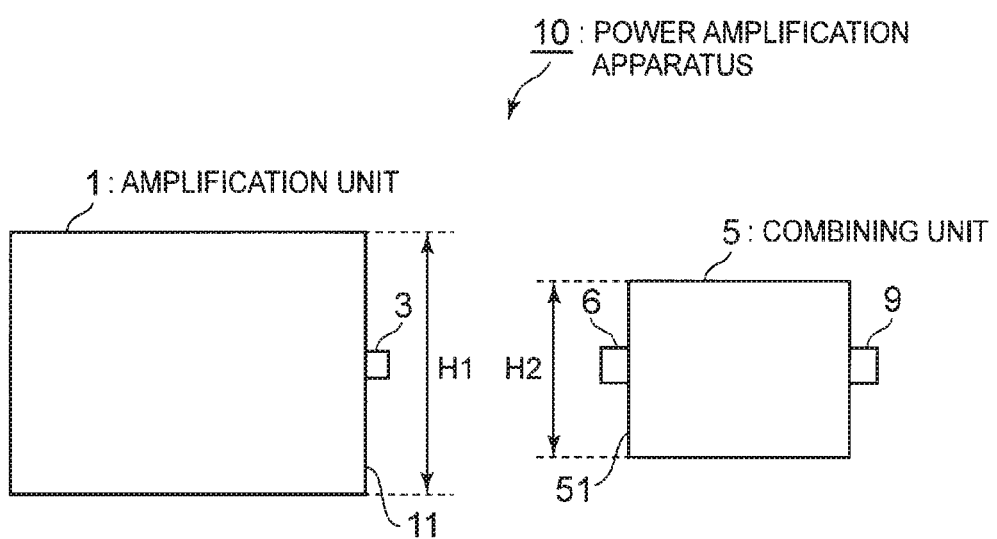
FIG. 2 is a side view of the power amplification apparatus.
Figure 3:
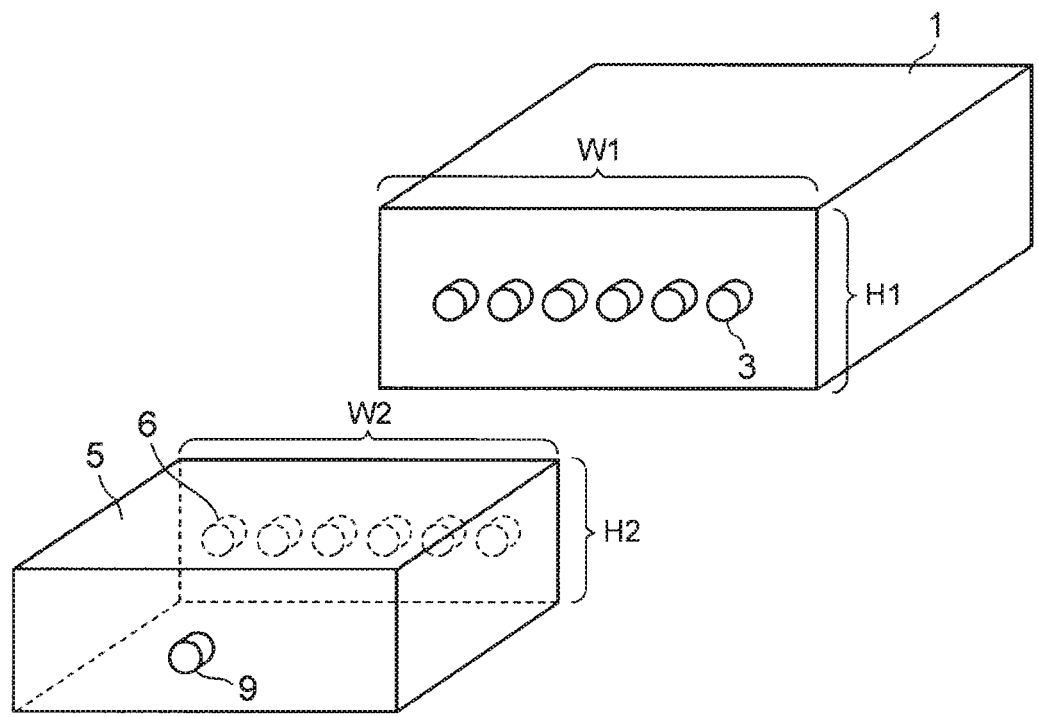
FIG. 3 is a perspective view of the power amplification apparatus.
Figure 4:
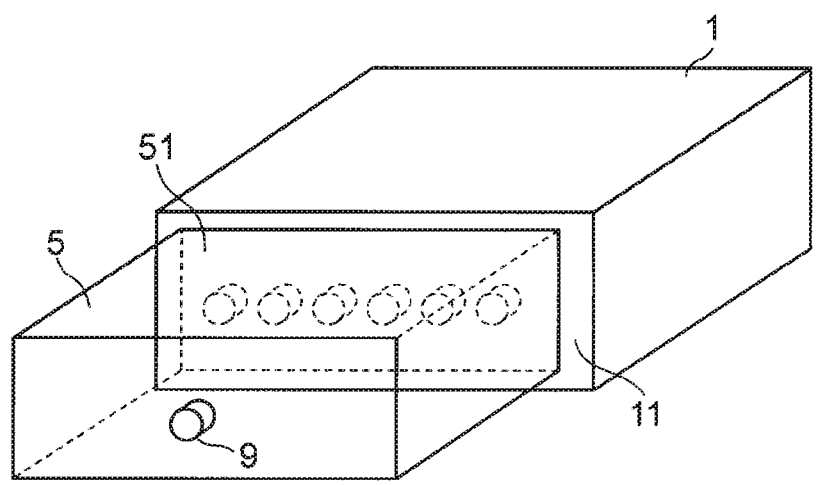
FIG. 4 is a perspective view in connecting an amplification unit and a combining unit.

Next, the relationship between the side surface 11 on which the output connectors 3 are disposed of the amplification unit 1 and the side surface 51 on which the input connectors 6 are disposed of the combining unit 5 is described. FIG. 2 is a side view of the power amplification apparatus 10. FIG. 3 is a perspective view of the power amplification apparatus 10. FIG. 4 is a perspective view in connecting the amplification unit 1 and the combining unit 5. The same components as the components illustrated in FIG. 1 are designated by the same reference numerals as those in FIG. 1. The width of the width of the side surface 51 of the combining unit 5 is equal to or lower than the width of the width of the side surface 11 of the amplification unit 1. More specifically, when the width of the width of the side surface 11 of the amplification unit 1 is set as W1 and the width of the width of the side surface 51 of the combining unit 5 is set as W2 (refer to FIG. 1 and FIG. 3), W2≤W1 is established. Furthermore, the height of the side surface 51 of the combining unit 5 is equal to or lower than the height of the side surface 11 of the amplification unit 1. More specifically, when the height of the side surface 11 of the amplification unit 1 is set as H1 and the height of the side surface 51 of the combining unit 5 is set as H2 (refer to FIG. 2 and FIG. 3), H2≤H1 is established. Therefore, the side surface 51 on which the input connectors 6 are disposed of the combining unit 5 is set within the dimension of the side surface 11 on which the output connectors 3 are disposed of the amplification unit 1. The output connectors 3 and the input connectors 6 are disposed so that the side surface 51 does not project from the range of the side surface 11 in the state where the amplification unit 1 and the combining unit 5 are connected to each other. As a result, as illustrated in FIG. 4, the side surface 51 does not project from the range of the side surface 11 in the state where the amplification unit 1 and the combining unit 5 are connected to each other.

Figure 5:
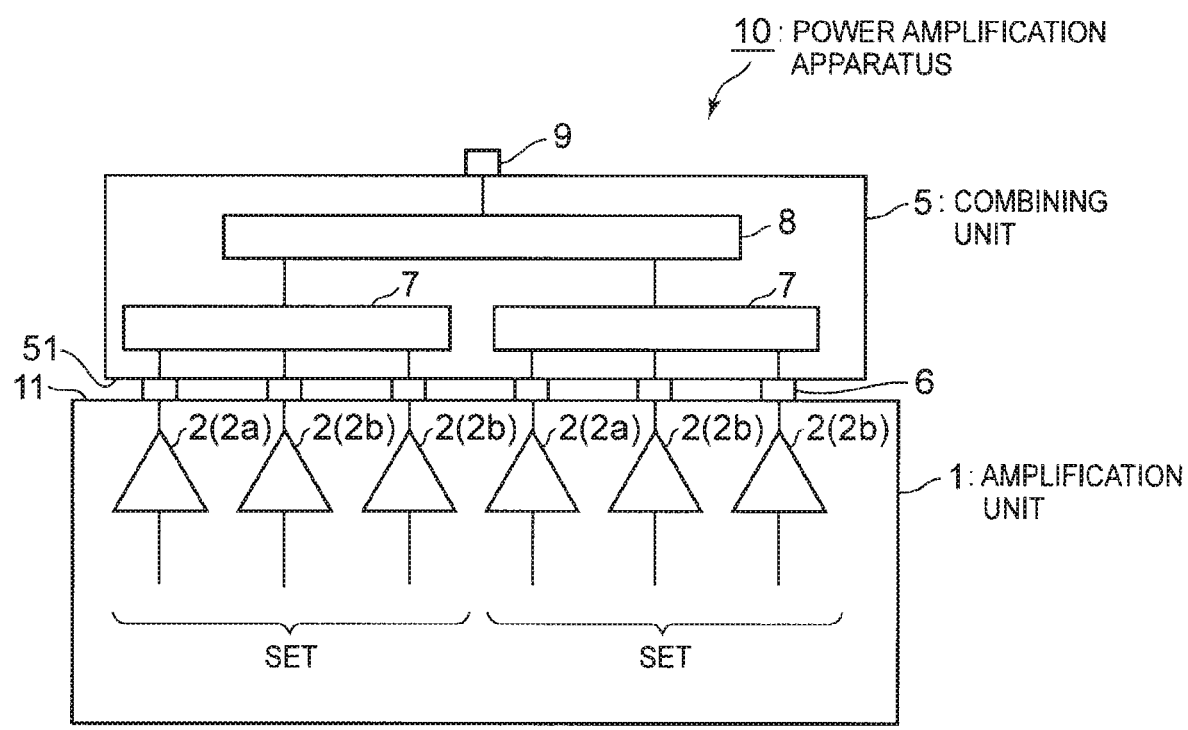
FIG. 5 is a schematic view illustrating an example of the configuration of the combining unit.

FIG. 5 is a schematic view illustrating an example of the configuration of the combining unit 5. FIG. 5 illustrates a state where the amplification unit 1 and the combining unit 5 illustrated in FIG. 1 are connected to each other. In the example illustrated in FIG. 5, as a result of connecting the output connectors 3 and the input connectors 6, each output connector 3 is present in the corresponding input connector 6. The combiners 7 are provided in the combining unit 5 corresponding to the sets of the amplification circuits 2 provided in the amplification unit 1. In the first embodiment, two or more of the sets of the amplification circuits 2 are present, and therefore the combining unit 5 has two or more of the combiners 7. In the example illustrated in FIG. 5, three amplification circuits 2 are set as one set and two sets of sets of the amplification circuits 2 are provided in the amplification unit 1, and therefore two combiners 7 are provided in the combining unit 5.

The combiners 7 are connected to the input connectors 6 corresponding to the amplification circuits 2 belonging to the set corresponding to the combiners 7. In other words, the input connectors 6 corresponding to the amplification circuits 2 are connected to the combiners 7 corresponding to the set (set of amplification circuits 2) to which the amplification circuits 2 belong. Into the combiner 7, an RF signal output from each amplification circuit 2 belonging to the set corresponding to the combiner 7 is input. The combiner 7 combines the RF signals, and then outputs the RF signal after the combination. In this example, RF signals output from the three amplification circuits 2 belonging to the set corresponding to the combiner 7 are input into the combiner 7.

In the present invention, when the combining unit 5 has two or more of the combiners 7, the combining unit 5 has one more combiner 8. In the first embodiment, the combining unit 5 has the plurality of combiners 7, and therefore further has one combiner 8. Hereinafter, in order to distinguish the combiner 7 and the combiner 8 from each other, the combiner 7 is referred to as a first combiner 7 and the combiner 8 is referred to as a second combiner 8. The second combiner 8 combines RF signals output from the first combiners 7, and then outputs the RF signal after the combination from the output end 9. The RF signal output from the output end 9 is transmitted to a device on the latter stage of the power amplification apparatus 10.

The frequency band of an RF signal which can be amplified by each amplification circuit 2 is a broadband. For example, each amplification circuit 2 is an amplification circuit usable for the entire UHF band or the entire VHF band.

On the other hand, the first combiner 7 is a combiner usable for RF signals of a specific frequency band. In other words, the first combiner 7 is a combiner limited in the frequency band of RF signals which can be combined. The first combiner 7 combines RF signals of a frequency band for which a television broadcasting organization using the power amplification apparatus 10 has obtained approval. As already described above, a broadcasting organization obtains approval of undertaking the broadcasting industry using the frequency band obtained by dividing the UHF band or the VHF band by a fixed bandwidth as the unit. The first combiner 7 is designed so as to be able to combine RF signals of the frequency band for which a broadcasting organization has obtained approval.

As the first combiner 7, a Doherty combiner may be used, for example. The Doherty combiner is a combiner combining an RF signal output by a main amplifier which always performs an amplification operation of an RF signal (hereinafter referred to as a main amplifier) and an RF signal output by a peak amplifier which operates when outputting high power (hereinafter referred to as peak amplifier). Hereinafter, a description is given taking a case where the first combiners 7 illustrated in FIG. 5 are all the Doherty combiners as an example.

The Doherty combiner has a transmission line (for example, copper plate) (not illustrated) and can adjust the frequency band of RF signals which can be combined based on the length of the transmission line. In the manufacturing of the first combiner 7, the frequency band of RF signals which can be combined is adjusted according to the frequency band for which a broadcasting organization using the power amplification apparatus 10 has obtained approval.

When using the Doherty combiner as the first combiner 7, the set (set of amplification circuits 2) corresponding to the first combiner 7 contains the amplification circuit 2 equivalent to the main amplifier and the amplification circuit 2 equivalent to the peak amplifier. Hereinafter, the amplification circuit equivalent to the main amplifier is designated by a reference numeral 2a and the amplification circuit equivalent to the peak amplifier is designated by a reference numeral 2b. In the power amplification apparatus 10 illustrated in FIG. 1 to FIG. 5, one of the three amplification circuits 2 contained in one set is the amplification circuit 2a equivalent to the main amplifier and the remaining two amplification circuits 2 are the amplification circuits 2b equivalent to the peak amplifier.

It can be changed based on the setting to the amplification circuit 2 whether the amplification circuit 2 is used as the main amplifier or used as the peak amplifier. Specifically, it can be determined based on a manner of applying a bias voltage to the amplification circuit 2 whether the amplification circuit 2 is used as the main amplifier or the peak amplifier.

A bias voltage may be applied to the amplification circuit 2a to be operated as the main amplifier so as to operate in Class AB or Class B.

A bias voltage may be applied to the amplification circuit 2b to be operated as the peak amplifier so as to operate in Class C.

As a result, each first combiner 7 combines an RF signal output by the one amplification circuit 2a which is set so as to operate in Class AB or Class B and RF signals output by the two amplification circuits 2b which are set so as to operate in Class C.

The second combiner 8 may be a combiner which can combine broadband RF signals. For example, the second combiner 8 may be a combiner capable of combining RF signals of the entire UHF band or the entire VHF band. For example, a 3-dB coupler may be used as the second combiner 8.

A Wilkinson combiner may be used as the second combiner 8.

Figure 6:
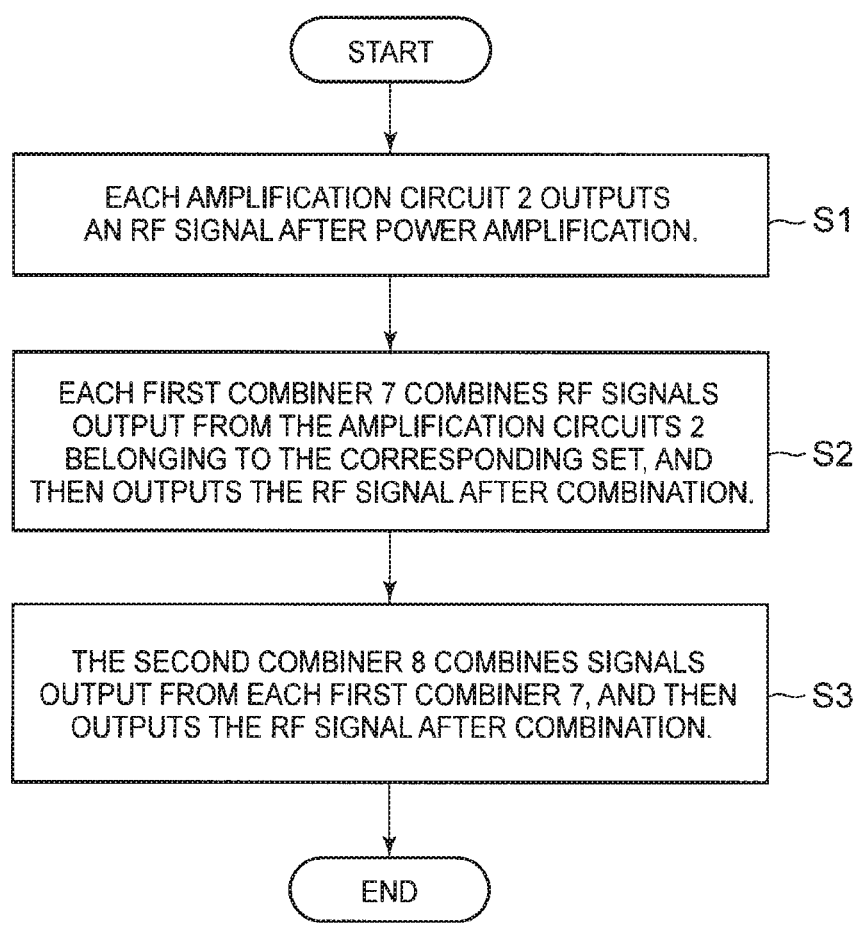
FIG. 6 is a flow chart illustrating an example of processing progress of the power amplification apparatus of the first embodiment of the present invention.

Next, processing progress of the power amplification apparatus 10 is described. FIG. 6 is a flow chart illustrating an example of the processing progress of the power amplification apparatus 10 of the first embodiment of the present invention. The output connectors 3 and the input connectors 6 corresponding to each other are simultaneously connected to each other, so that the amplification unit 1 and the combining unit 5 are in a connection state. The power amplification apparatus 10 is in an operation state.

RF signals are input into the one amplification circuit 2a and the two amplification circuits 2b forming a set. The frequency band of the RF signals is set within the frequency band for which a broadcasting organization using the power amplification apparatus 10 has obtained approval. The amplification circuit 2a operates as the main amplifier and the amplification circuits 2b operates as the peak amplifier. The amplification circuits 2a and 2b output RF signals after power amplification to the first combiner 7 corresponding to the set. Each set of the amplification circuits 2 similarly operates (Step S1). In Step S1, each amplification circuit 2 outputs the RF signal after power amplification to the first combiner 7 corresponding to the set to which the amplification circuits 2 belong through the output connectors 3 and the input connectors 6 connected to each other.

Each first combiner 7 combines RF signals output from the one amplification circuit 2a and the two amplification circuits 2b belonging to the corresponding set, and then outputs the RF signal after the combination to the second combiner 8 (Step S2).

The second combiner 8 combines the RF signal output from each first combiner 7, and then outputs the RF signal after the combination from the output end 9 (Step S3). The RF signal output from the output end 9 is transmitted to a device on the latter stage of the power amplification apparatus 10.

According to this embodiment, the amplification unit 1 and the combining unit 5 are attachable/detachable through the output connectors 3 and the input connectors 6. Therefore, the component for power amplification of RF signals and the component for combination of RF signals can be separated from each other. Specifically, the amplification unit 1 and the combining unit 5 can be separated from each other.

Therefore, a manufacturer manufacturing the power amplification apparatus 10 can manufacture the amplification unit 1 in a standardized manner irrespective of broadcasting organizations.

It is supposed that a broadcasting organization has obtained approval of the broadcasting industry for a plurality of kinds of frequency bands, and uses the power amplification apparatus 10 different for each frequency band for which a broadcasting organization has obtained approval. The amplification units 1 of the power amplification apparatuses 10 are standardized irrespective of the frequency bands. Therefore, when the broadcasting organization has a spare amplification unit 1, the broadcasting organization can exchange the amplification unit 1 in which a failure has occurred by the spare amplification unit 1 even when the failure has occurred in the amplification unit 1 of any power amplification apparatus 10, and thus can quickly restore the power amplification apparatus 10.

As described above, the broadcasting organization obtains approval of undertaking the broadcasting industry using the frequency band obtained by dividing the UHF band or the VHF band by a fixed bandwidth as the unit. The first combiner 7 is designed so as to be able to combine RF signals of the frequency band for which a broadcasting organization has obtained approval. According to the present invention, the amplification unit 1 does not contain a circuit combining RF signals output by the amplification circuits 2. When the amplification unit 1 and the combining unit 5 are connected to each other, the first combiner 7 can combine RF signals of the frequency band for which a broadcasting organization has obtained approval. More specifically, the frequency bandwidth of RF signals which can be combined by the first combiner 7 can be appropriately determined.

The amplification unit 1 does not contain a circuit combining RF signals output by the amplification circuits 2. The output connectors 3 outputs RF signals output by the corresponding amplification circuits 2 as they are in the shortest distance. Therefore, the passing loss in the amplification unit 1 can be suppressed, so that the power consumption efficiency can be increased.

Moreover, by the use of the Doherty combiner as the first combiner 7, the power consumption efficiency in power amplification of RF signals can be improved. When the Doherty combiner is used, the power consumption efficiency in power amplification of RF signals can be improved by setting the plurality of amplification circuits 2 outputting RF signals to the Doherty combiner as the main amplifier or the peak amplifier and using the Doherty combiner which is optimally adjusted based on the frequency to be used. Furthermore, a reduction in power consumption can be realized due to the improvement of the power consumption efficiency in power amplification.

The power amplification apparatus 10 is accommodated in a rack to be used. Since the device on the latter stage side is generally accommodated in the back side of the rack as described above, the combining unit 5 is disposed on the deep side relative to the amplification unit 1 in the rack. In the present invention, the amplification unit 1 has the output connectors 3 arranged in the transverse direction and the combining unit 5 has the input connectors 6 arranged in the transverse direction. Then, by connecting the output connectors 3 and the input connectors 6, the amplification unit 1 and the combining unit 5 are brought into a connection state. Furthermore, the side surface 51 on which the input connectors 6 are disposed of the combining unit 5 is set within the dimension of the side surface 11 on which the output connectors 3 are disposed of the amplification unit 1. Therefore, when the combining unit 5 breaks down, an operator can also take out the combining unit 5 when removing the one amplification unit 1 connected to the combining unit 5, and thus can easily exchange the combining unit 5.

Figure 7:
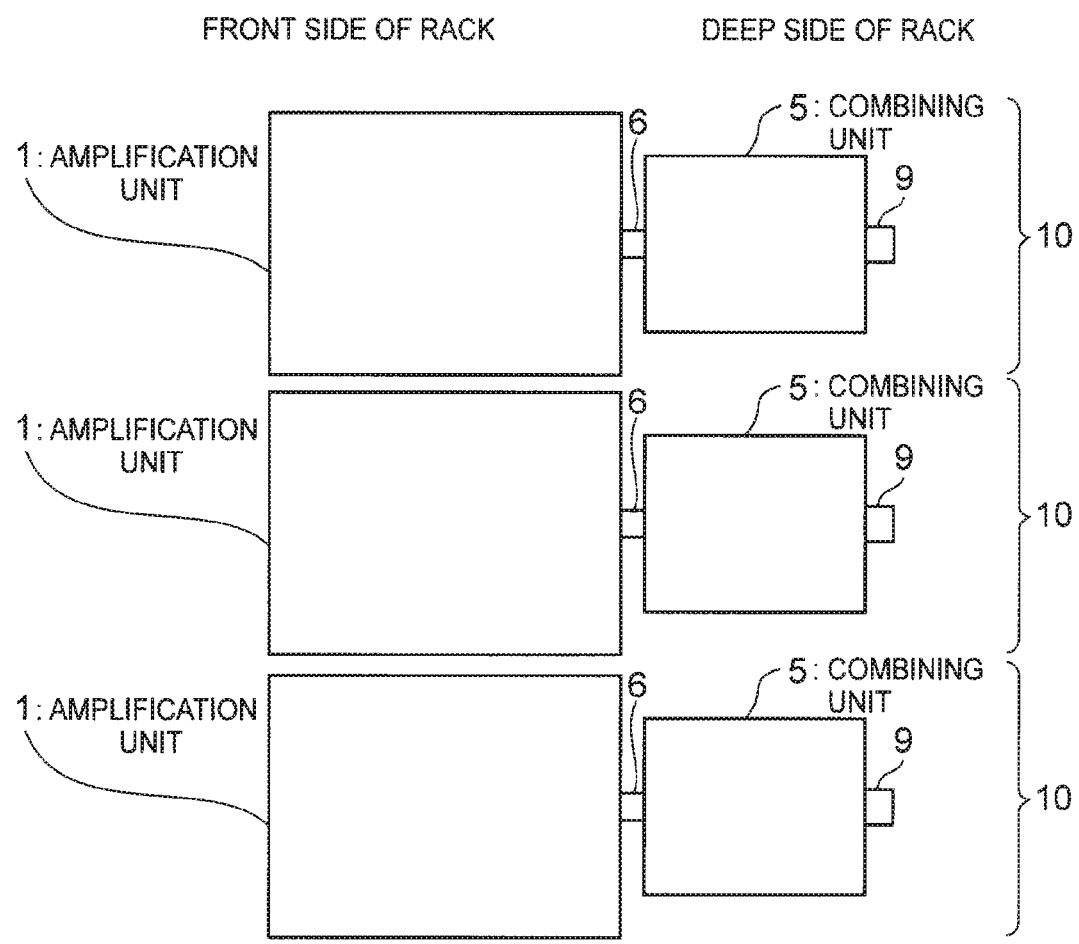
FIG. 7 is a schematic view illustrating a state where a plurality of power amplification apparatuses is disposed.

The power amplification apparatus 10 is applied to a television signal transmission system described in a third embodiment described later. At this time, only the one power amplification apparatus 10 may be used or two or more of the power amplification apparatuses 10 may be used. FIG. 7 is a schematic view illustrating a state where the plurality of power amplification apparatuses 10 is disposed. When the plurality of power amplification apparatuses 10 is used, the plurality of power amplification apparatuses 10 is disposed in a plurality of stages in the vertical direction in a rack (not illustrated). FIG. 7 illustrates a state where three power amplification apparatuses 10 are disposed in up-and-down information in three stages. For example, it is supposed that the combining unit 5 of the power amplification apparatus 10 on the second stage from the top breaks down. In this case, an operator can also take out the broken down combining unit 5 from the rack by taking out the amplification unit 1 of the power amplification apparatus 10 on the second stage from the top from the rack. Thus, when exchanging the broken down combining unit 5, there is no necessity of taking out the plurality of amplification units 1, and thus the combining unit 5 can be easily exchanged.

When only one power amplification apparatus 10 is used, the one power amplification apparatus 10 is disposed in a rack (not illustrated). Also in the case, when the combining unit 5 breaks down, an operator can also take out the broken combining unit 5 from the rack when taking out the amplification unit 1 of the power amplification apparatus 10 from the rack, and thus can easily exchange the combining unit 5.

Each input connector 6 is a floating connector. Therefore, even when the arrangement positions of the output connectors 3 of the amplification unit 1 are somewhat shifted, the output connectors 3 and the input connectors 6 corresponding to each other can be simultaneously connected to each other.

Next, a modification of this embodiment is described.

The description above describes the case where one of the three amplification circuits 2 contained in one set is the amplification circuit 2a equivalent to the main amplifier and the remaining two amplification circuits 2 are the amplification circuits 2b equivalent to the peak amplifier. The two amplification circuits 2 of the three amplification circuits 2 contained in one set may be the amplification circuits 2a equivalent to the main amplifier and the remaining one amplification circuit 2b may be the amplification circuit 2b equivalent to the peak amplifier.

Moreover, the number of the amplification circuits 2 contained in one set may be two. Hereinafter, a case where the two amplification circuits 2 are set as one set is described. The following description is given taking a case where the number of the sets of the amplification circuits 2 contained in the amplification unit 1 is two as an example in the same manner as in the embodiment described above but the number of the sets of the amplification circuits 2 contained in the amplification unit 1 may be three or more.

Figure 8:
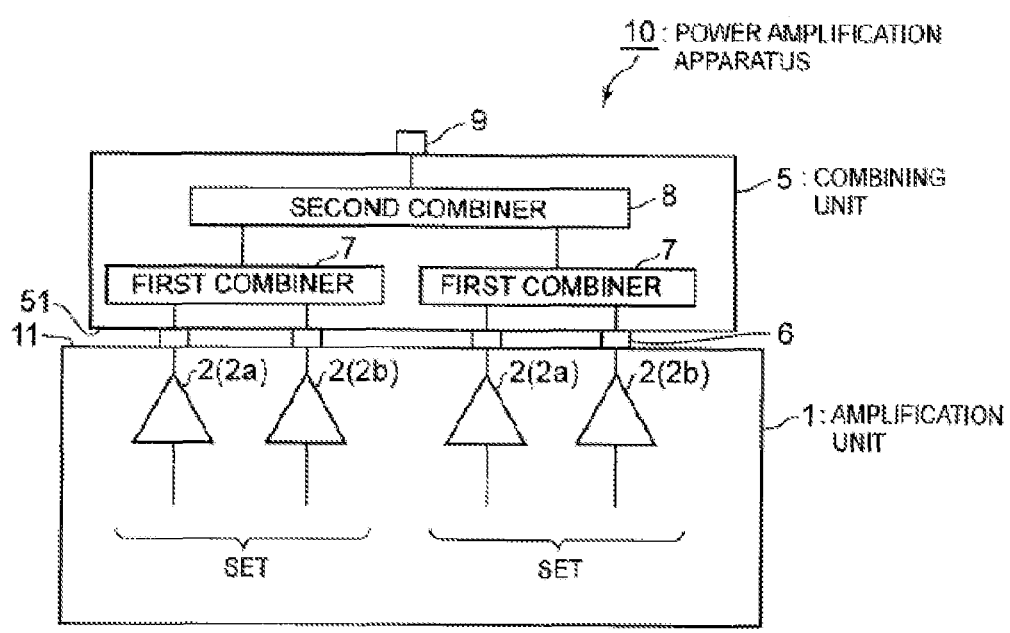
FIG. 8 is a schematic view illustrating an example of the power amplification apparatus when two amplification circuits 2 are set as one set.

FIG. 8 is a schematic view illustrating an example of a power amplification apparatus when two amplification circuits 2 are set as one set. The same components as the components illustrated in FIG. 1 to FIG. 5 are designated by the same reference numerals as those in FIG. 1 to FIG. 5 and a detailed description therefor is omitted. In the example illustrated in FIG. 8, as a result of connecting the output connectors 3 and the input connectors 6, each output connector 3 is present in the corresponding input connector 6.

In the configuration illustrated in FIG. 8, two amplification circuits 2 are set as one set, and therefore the number of the output connectors 3 and the input connectors 6 each is four, which is different from the configuration illustrated in FIG. 1. However, the arrangement of the output connectors 3 and the input connectors 6 and the relationship between the side surface 11 on which the output connectors 3 are disposed of the amplification unit 1 and the side surface 51 on which the input connectors 6 are disposed of the combining unit 5 are the same as those of the above-described embodiment.

Also in the configuration illustrated in FIG. 8, the combining unit 5 has a plurality of first combiners 7 and one second combiner 8 in the same manner as in the case illustrated in FIG. 5. In the example illustrated in FIG. 8, two amplification circuits 2 are set as one set and two sets of the amplification circuits 2 are provided, and therefore two first combiners 7 are provided in the combining unit 5. Into the first combiners 7, RF signals output from the two amplification circuits 2 belonging to the set corresponding to the first combiners 7 are input. The first combiners 7 combine the RF signals, and then output the RF signals after the combination to the second combiner 8.

The first combiner 7 is a combiner usable for RF signals of a specific frequency band. In other words, the first combiner 7 is a combiner limited in the frequency band of RF signals which can be combined. Herein, a description is given taking a case where the first combiners 7 are all the Doherty combiners as an example.

In the example illustrated in FIG. 8, the set (set of amplification circuits 2) corresponding to the first combiner 7 contains two amplification circuits 2. When the Doherty combiner is used as the first combiner 7, one of the two amplification circuits 2 belonging to one set may be used as the main amplifier and the other one may be used as the peak amplifier. A bias voltage may be applied to the amplification circuit 2a to be operated as the main amplifier so as to operate in Class AB or Class B. A bias voltage may be applied to the amplification circuit 2b to be operated as the peak amplifier so as to operate in Class C.

As a result, each first combiner 7 combines an RF signal output by the one amplification circuit 2a which is set so as to operate in Class AB or Class B and an RF signal output by the one amplification circuit 2b which is set so as to operate in Class C.

Processing progress of the power amplification apparatus 10 of the configuration of illustrated in FIG. 8 is the same as that of Steps S1 to S3 already described above, and thus a description therefor is omitted.

As illustrated in FIG. 8, also when the two amplification circuits 2 are set as one set, the same effects as those in the case where the three amplification circuits 2 are set as one set are obtained.

Each first combiner 7 may be a Wilkinson combiner. When the Wilkinson combiner is used as each first combiner 7, all the amplification circuits 2 belonging to each set are set so as to perform an operation in Class AB. For example, as illustrated in FIG. 8, it is supposed that the two amplification circuits 2 are set as one set, and then two or more of the sets of the amplification circuits 2 are provided in the amplification unit 1. Moreover, it is supposed that the Wilkinson combiner is provided in the combining unit 5 as the first combiner 7 corresponding to each set. In this case, a bias voltage may be applied to each amplification circuit 2 belonging to each set so as to perform an operation in Class AB.

However, the power consumption efficiency in power amplification is higher in the case of using the Doherty combiner as the first combiner 7 than in the case of using the Wilkinson combiner as the first combiner 7. Therefore, it is more preferable to use the Doherty combiner as the first combiner 7.

Embodiment 2

Figure 9:
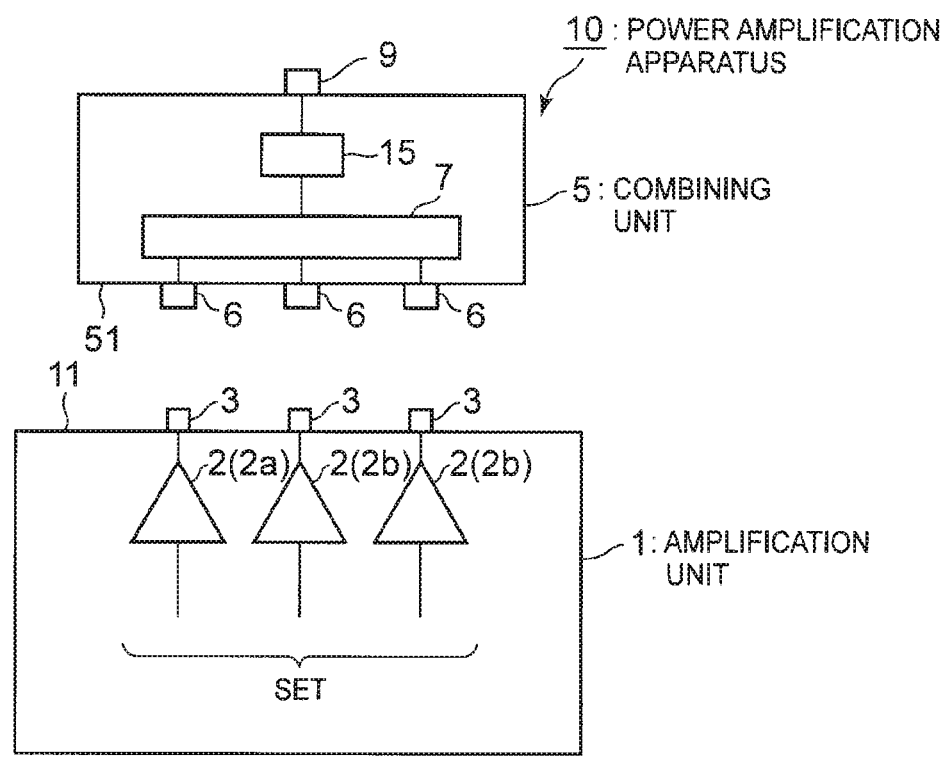
FIG. 9 is a schematic view illustrating an example of a power amplification apparatus of a second embodiment of the present invention.

A second embodiment of the present invention describes a case where one set of the amplification circuits 2 containing a predetermined number of the amplification circuits 2 is provided in the amplification unit 1. FIG. 9 is a schematic view illustrating an example of a power amplification apparatus of the second embodiment of the present invention. The same components as the components described in the first embodiment are designated by the same reference numerals as those in the first embodiment and a detailed description therefor is omitted.

In the present invention, the combiner 7 is provided corresponding to the set of the amplification circuits 2 provided in the amplification unit 1. In the second embodiment, one set of the amplification circuits 2 containing a predetermined number of the amplification circuits 2 is provided in the amplification unit 1, and therefore the combining unit 5 has one combiner 7 corresponding to the one set. The number of the combiners 7 provided in the combining unit 5 is one, and therefore the second combiner 8 (refer to FIG. 5) is not provided in the combining unit 5 in the second embodiment. In general, the return loss characteristics as viewed from the output side of an FET are not good and total reflection occurs. Therefore, in order to improve the return loss characteristics as viewed from the output side, the combining unit 5 may have an isolator 15 on the latter stage of the one combiner 7.

In the example illustrated in FIG. 9, the amplification unit 1 has one set containing three amplification circuits 2. Therefore, the number of the output connectors 3 provided in the amplification unit 1 and the number of the input connectors 6 provided in the combining unit 5 each are three. However, the arrangement of the output connectors 3 and the input connectors 6 and the relationship between the side surface 11 on which the output connectors 3 are disposed of the amplification unit 1 and the side surface 51 on which the input connectors 6 are disposed of the combining unit 5 are the same as those of the first embodiment.

The combiner 7 is a Doherty combiner, for example. When the Doherty combiner is used as the combiner 7, one of the three amplification circuits 2 contained in the set of the amplification circuits 2 may be used as the main amplifier and the remaining two amplification circuits 2 may be used as the peak amplifier. A bias voltage may be applied to the amplification circuit 2a to be operated as the main amplifier so as to operate in Class AB or Class B. A bias voltage may be applied to the amplification circuits 2b to be operated as the peak amplifier so as to operate in Class C.

As a result, the combiner 7 combines an RF signal output by the one amplification circuit 2a which is set so as to operate in Class AB or Class B and RF signals output by the two amplification circuits 2b which are set so as to operate in Class C. The combiner 7 outputs the signal after the combination from the output end 9 through the isolator 15. The output end 9 is provided on the side surface opposite to the side surface 51 on which the input connectors 6 are disposed in the combining unit 5 in the same manner as in the first embodiment. The RF signal output from the output end 9 is transmitted to a device on the latter stage of the power amplification apparatus 10.

Figure 10:
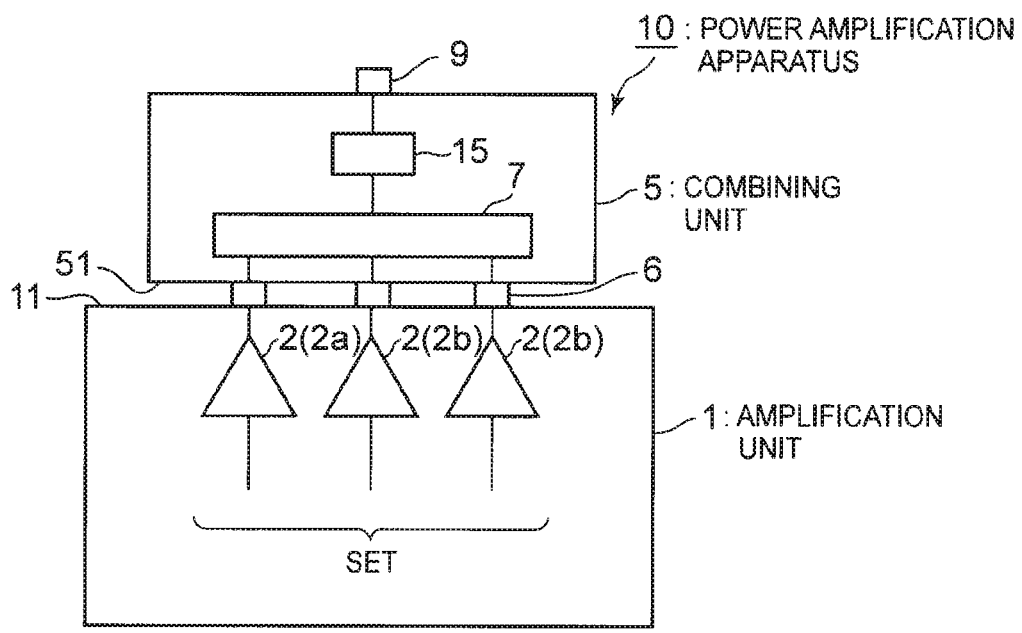
FIG. 10 is a schematic view illustrating a state where an amplification unit and a combining unit are connected to each other.

FIG. 10 is a schematic view illustrating a state where the amplification unit 1 and the combining unit 5 are connected to each other in the second embodiment of the present invention. By simultaneously connecting the output connectors 3 and the input connectors 6 corresponding to each other in the same manner as in the first embodiment, the amplification unit 1 and the combining unit 5 are brought into a connection state. In the example illustrated in FIG. 10, as a result of connecting the output connectors 3 and the input connectors 6, each output connector 3 is present in the corresponding input connector 6.

Figure 11:
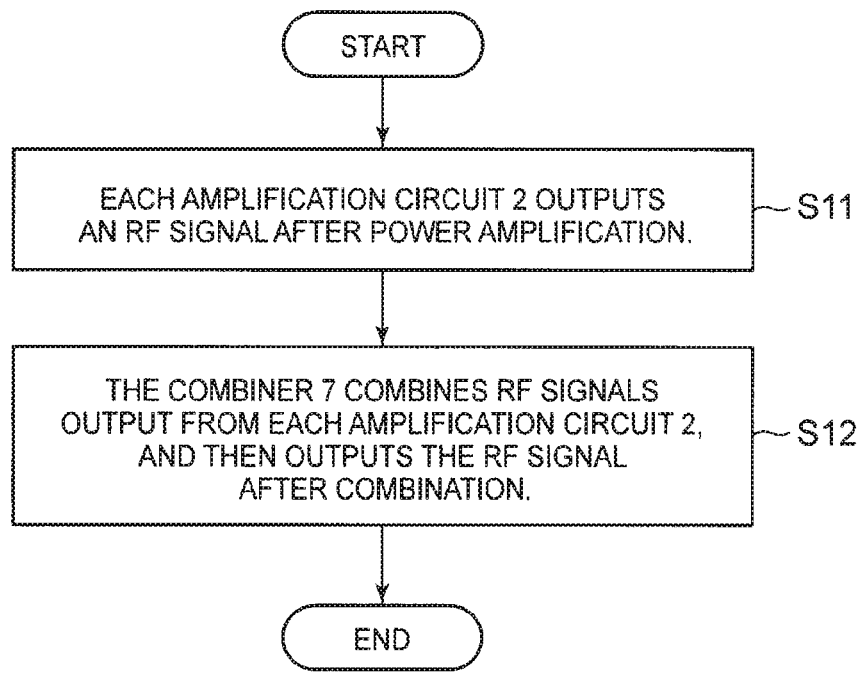
FIG. 11 is a flow chart illustrating an example of processing progress of the power amplification apparatus of the second embodiment of the present invention.

Next, processing progress of the power amplification apparatus 10 is described. FIG. 11 is a flow chart illustrating an example of the processing progress of the power amplification apparatus 10 of the second embodiment of the present invention. As illustrated in FIG. 10, the amplification unit 1 and the combining unit 5 are in the connection state and the power amplification apparatus 10 is in an operation state.

An RF signal is input into the one amplification circuit 2a and the two amplification circuits 2b forming a set. The frequency band of the RF signal is set in the frequency band for which a broadcasting organization using the power amplification apparatus 10 has obtained approval. The amplification circuit 2a operates as the main amplifier, the amplification circuits 2b operate as the peak amplifier, and the amplification circuits 2a and 2b output RF signals after power amplification to the combiner 7 (Step S11). In Step S11, each amplification circuit 2 outputs the RF signal after power amplification to the combiner 7 through the output connectors 3 and the input connectors 6 connected to each other.

The combiner 7 combines RF signals output from the one amplification circuit 2a and the two amplification circuits 2b, and then outputs the RF signal after the combination from the output end 9 through the isolator 15. The RF signal output from the output end 9 is transmitted to a device on the latter stage of the power amplification apparatus 10.

Also in the second embodiment, the same effects as those of the first embodiment are obtained.

Moreover, various modifications described in the first embodiment are also applied to the second embodiment.

For example, two amplification circuits 2 of the three amplification circuits 2 contained in one set may be the amplification circuits 2a equivalent to the main amplifier and the remaining one amplification circuit 2 may be the amplification circuit 2b equivalent to the peak amplifier.

For example, a configuration in which the set of the amplification circuits 2 contains two amplification circuits may be acceptable. When the combiner 7 is the Doherty combiner, one amplification circuit 2 of the two amplification circuits 2 may be used as the main amplifier and the other amplification circuit 2 may be used as the peak amplifier. A bias voltage may be applied to the amplification circuit 2a to be operated as the main amplifier so as to operate in Class AB or B. A bias voltage may be applied to the amplification circuit 2b to be operated as the peak amplifier so as to operate in Class C.

For example, the combiner 7 may be a Wilkinson combiner. For example, it is supposed that one set of the amplification circuits 2 containing two amplification circuits 2 is provided in the amplification unit 1. Moreover, it is supposed that the Wilkinson combiner is provided as the one combiner 7 corresponding to the set in the combining unit 5. In this case, a bias voltage may be applied to the two amplification circuits 2 so as to operate in Class AB.

Figure 12:
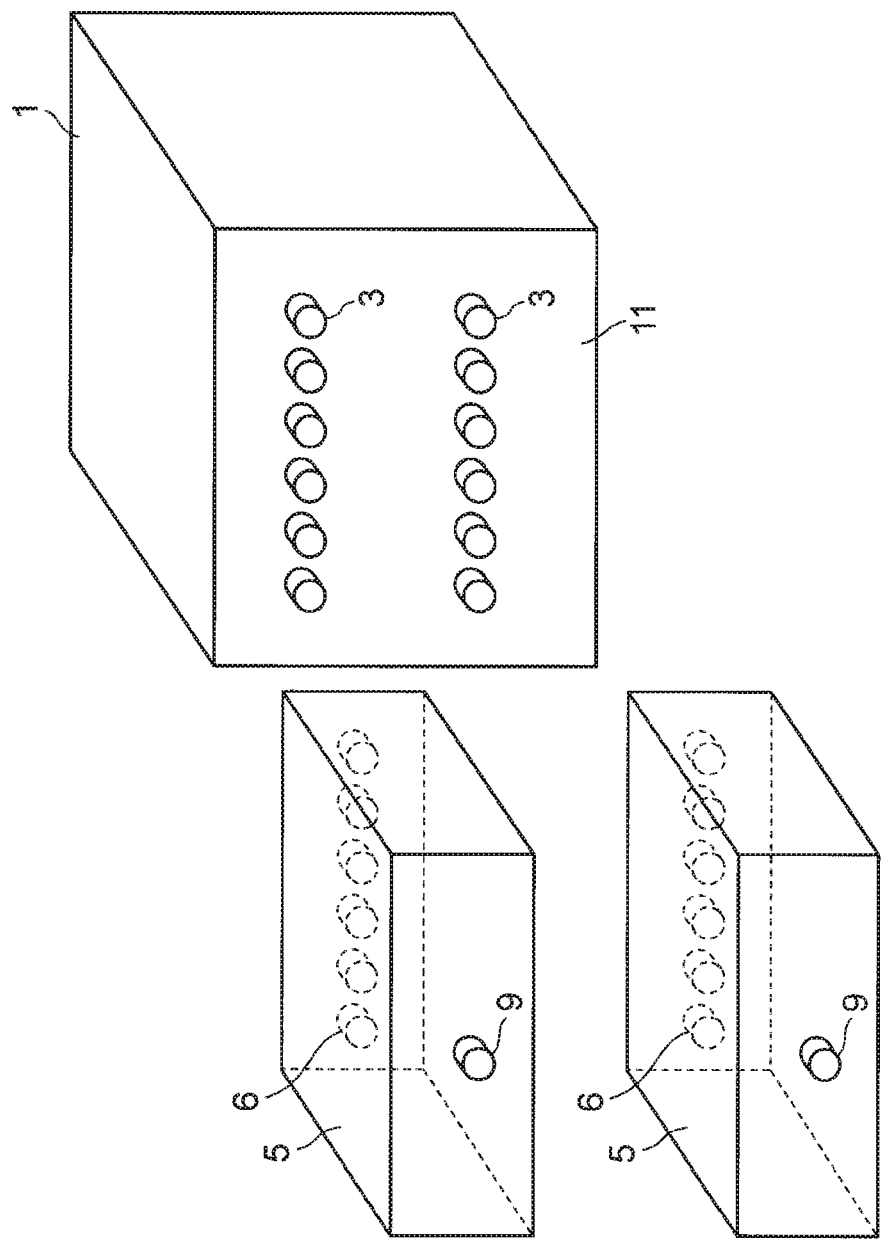
FIG. 12 is an explanatory view illustrating an example of an amplification unit in which output connectors 3 arranged in the transverse direction are disposed in two stages.

In the first embodiment and the second embodiment, the output connectors 3 arranged in the transverse direction may be disposed in a plurality of stages on the side surface 11 on which the output connectors 3 are disposed of the amplification unit 1. FIG. 12 is a view illustrating an example of the amplification unit 1 in which the output connectors 3 arranged in the transverse direction are disposed in two stages. In the example illustrated in FIG. 12, six output connectors 3 arranged in the transverse direction are disposed in two stages on the side surface 11 of the amplification unit 1. The number of the output connectors 3 arranged in each stage is common. Moreover, the amplification unit 1 is provided with the amplification circuits 2 (not illustrated in FIG. 12) corresponding to the six output connectors 3 on the upper stage arranged in the transverse direction and the amplification circuits 2 (not illustrated in FIG. 12) corresponding to the six output connectors 3 on the lower stage arranged in the transverse direction. In this case, the power amplification apparatus 10 may have two combining units 5 having the six input connectors 6 corresponding to the six output connectors 3, and then one combining unit 5 may be connected to the six output connectors 3 on the upper stage arranged in the transverse direction and the other combining unit 5 may be connected to the six output connectors 3 on the upper stage arranged in the transverse direction. At this time, the two combining units 5 may be disposed in one chassis.

Embodiment 3

Figure 13:
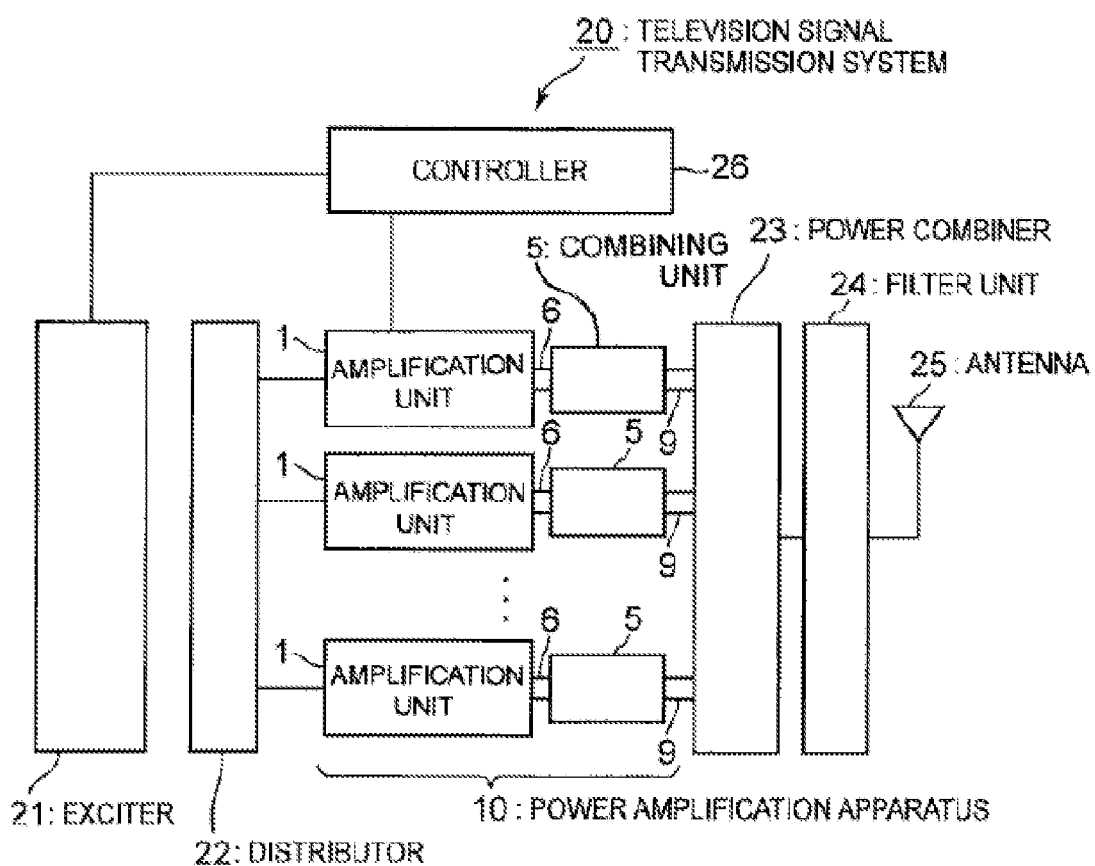
FIG. 13 is a block diagram illustrating an example of the configuration of a television signal transmission system of a third embodiment of the present invention.

Next, a television signal transmission system is described as a third embodiment of the present invention. FIG. 13 is a block diagram illustrating an example of the configuration of the television signal transmission system of the third embodiment of the present invention. A television signal transmission system 20 illustrated in FIG. 13 has two or more of the power amplification apparatuses 10 each containing the amplification unit 1 and the combining unit 5. The power amplification apparatus 10 may be the power amplification apparatus 10 described in the first embodiment or the modification thereof or may be the power amplification apparatus 10 described in the second embodiment or the modification thereof. However, the power amplification apparatuses 10 have the same configuration. The following description is given taking a case where the television signal transmission system 20 has two or more of the power amplification apparatuses 10 described in the first embodiment as an example.

In a rack (not illustrated), the plurality of power amplification apparatuses 10 is disposed in a plurality of stages in the vertical direction. In FIG. 13, the amplification units 1 and the combining units 5 are connected to each other and the output connectors 3 are present in the corresponding input connectors 6. FIG. 13 does not illustrate the amplification circuit 2 in the amplification unit 1 and the first combiner 7 and the second combiner 8 in the combining unit 5.

The television signal transmission system 20 further has an exciter 21, a distributor 22, a power combiner 23, a filter unit 24, an antenna 25, and a controller 26.

The exciter 21 is connected to the distributor 22. The exciter 21 generates an RF signal to be transmitted as a television signal, and then outputs the resultant RF signal to the distributor 22. The frequency band of the RF signal is a frequency band for which a broadcasting organization using the television signal transmission system 20 has obtained approval.

The distributor 22 is connected to the amplification unit 1 of each power amplification apparatus 10. Each amplification unit 1 and the distributor 22 are attachable/detachable. For example, a configuration in which each output connector of the branching filter 22 and each input connector of each power amplification apparatus 10 (more specifically each amplification unit 1) are connected to each other with a coaxial cable may be acceptable.

The distributor 22 distributes an RF signal output from the exciter 21 to each amplification circuit 2 provided in the amplification unit 1 of each power amplification apparatus 10.

The power combiner 23 is connected to the combining unit 5 of each power amplification apparatus 10. Each combining unit 5 and the power combiner 23 are attachable/detachable.

The power combiner 23 performs power combination of an RF signal output from the combining unit 5 of each power amplification apparatus 10, and then outputs the resultant signal through the filter unit 24 and the antenna 25.

The filter unit 24 is a bandpass filter passing only RF signals of the frequency band for which a broadcasting organization using the television signal transmission system 20 has obtained approval.

The controller 26 switches ON/OFF of the operation of the exciter 21 or monitors the state of each amplification unit 1.

Figure 14:
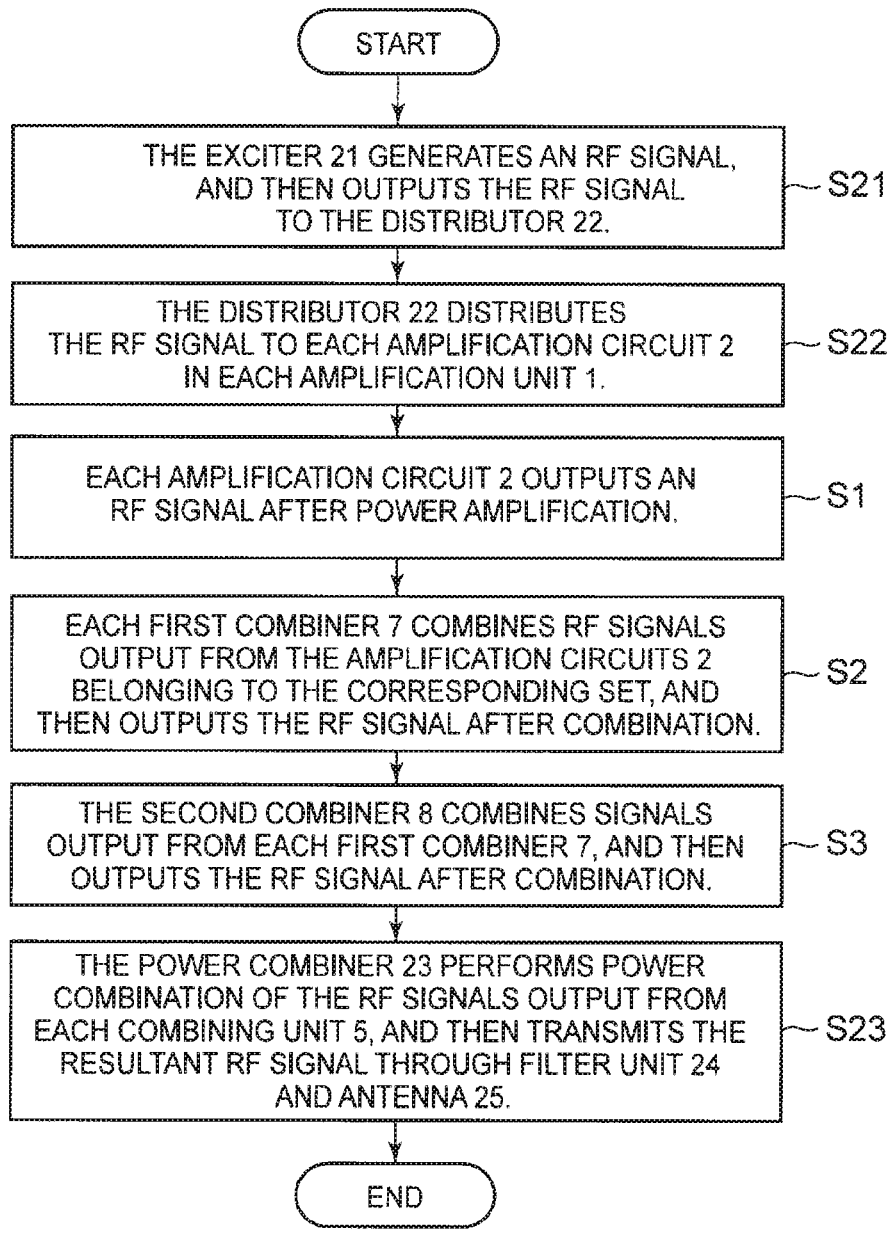
FIG. 14 is a flow chart illustrating an example of processing progress of the television signal transmission system.

Next, processing progress of the television signal transmission system 20 is described. FIG. 14 is a flow chart illustrating an example of the processing progress of the television signal transmission system 20.

The exciter 21 generates an RF signal, and then outputs the RF signal to the distributor 22 (Step S21).

Next, the distributor 22 distributes the RF signal output from the exciter 21 to each amplification circuit 2 (not illustrated in FIG. 13) in each amplification unit 1 (Step S22).

Operations of the power amplification apparatus 10 after Step S22 are the same as the already described operations (Steps 1 to 3 in the first embodiment in this example), and thus a description therefor is omitted herein.

After Step S3, the power combiner 23 performs power combination of the RF signals output from the output end 9 by each combining unit 5, and then transmits the resultant RF signal through the filter unit 24 and the antenna 25 (Step S23).

The television signal transmission system 20 of this embodiment has the power amplification apparatus 10 described in the first embodiment or the modification thereof or the power amplification apparatus 10 described in the second embodiment or the modification thereof. Therefore, also in this embodiment, the same effects as those of the first embodiment or the second embodiment are obtained.

Figure 15:
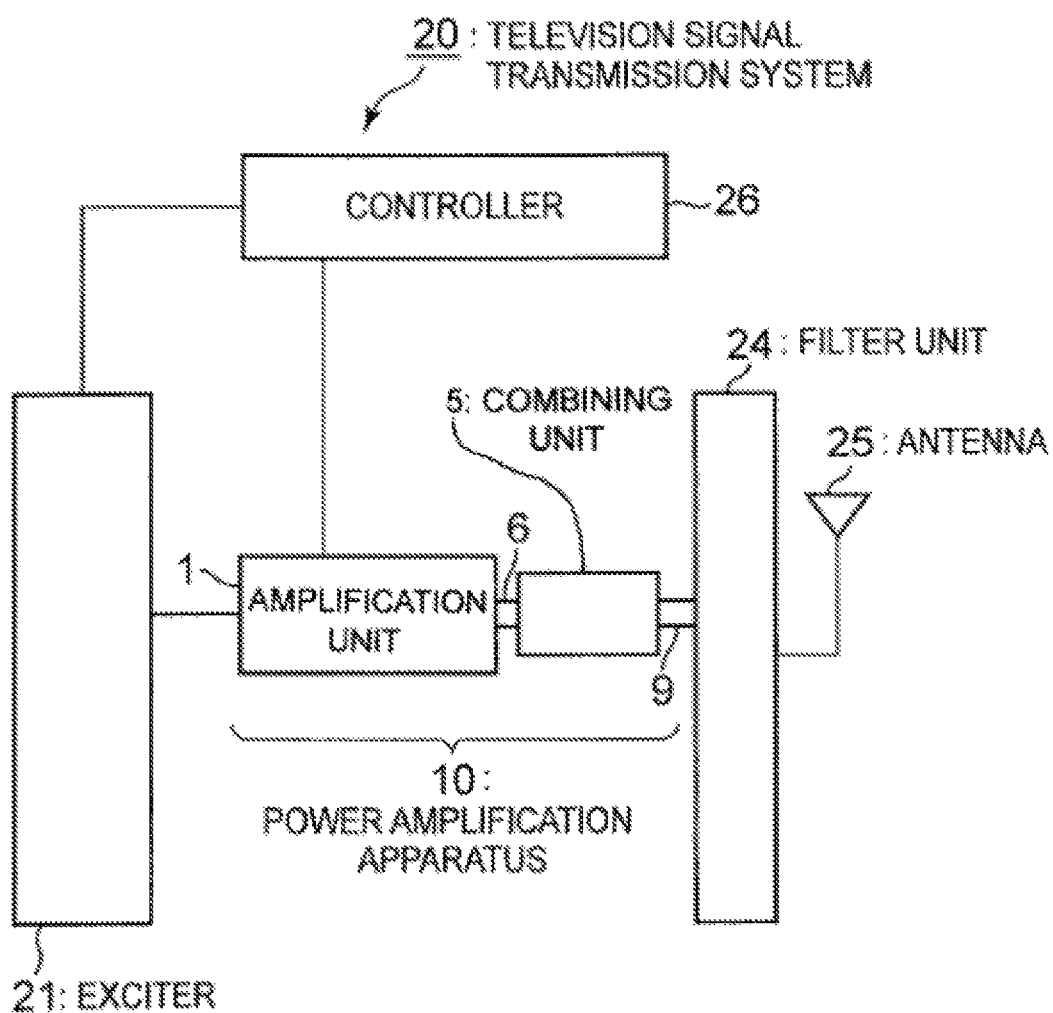
FIG. 15 is a block diagram illustrating an example of a television signal transmission system having one power amplification apparatus.

The television signal transmission system 20 may be configured so as to have one power amplification apparatus 10. FIG. 15 is a block diagram illustrating an example of a television signal transmission system having one power amplification apparatus 10. The same components as the components illustrated in FIG. 13 are designated by the same reference numerals as those in FIG. 13 and a description therefor is omitted.

When the number of the power amplification apparatus 10 provided in the television signal transmission system 20 is one, the distributor 22 and the power combiner 23 may not be provided (refer to FIG. 15). This is because there is no necessity of performing power combination of RF signals output from two or more of the combining units 5.

In the configuration illustrated in FIG. 15, the combining unit 5 and the filter unit 24 are attachable/detachable. For example, a configuration in which the output connector (the output end 9 described above) of the combining unit 5 and the input connector of the filter unit 24 are connected to each other with a coaxial feeder may be acceptable. The amplification unit 1 and the exciter 21 are attachable/detachable. For example, a configuration in which the output connector of the exciter 21 and the input connector of the amplification unit 1 are connected to each other with a coaxial cable may be acceptable.

In the configuration illustrated in FIG. 15, the combining unit 5 of the power amplification apparatus 10 transmits an RF signal after the combination through the filter unit 24 and the antenna 25.

Figure 16:
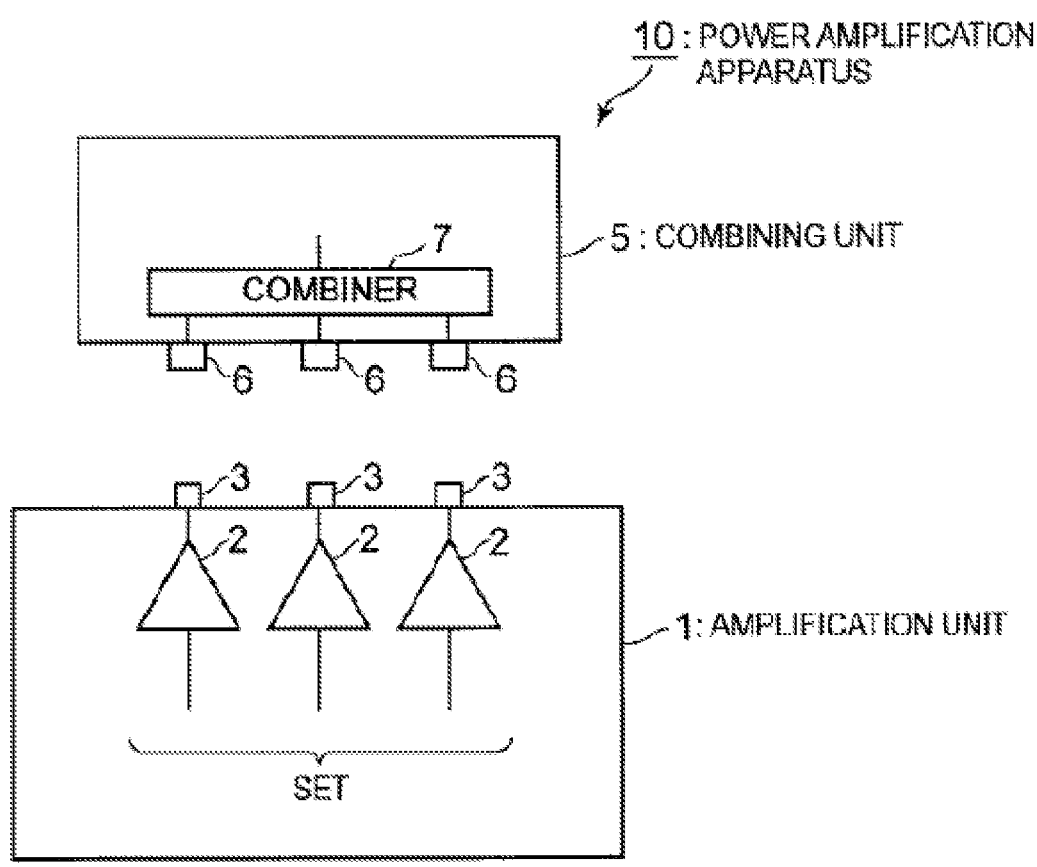
FIG. 16 is a block diagram illustrating the outline of the power amplification apparatus of the present invention.
Figure 17:
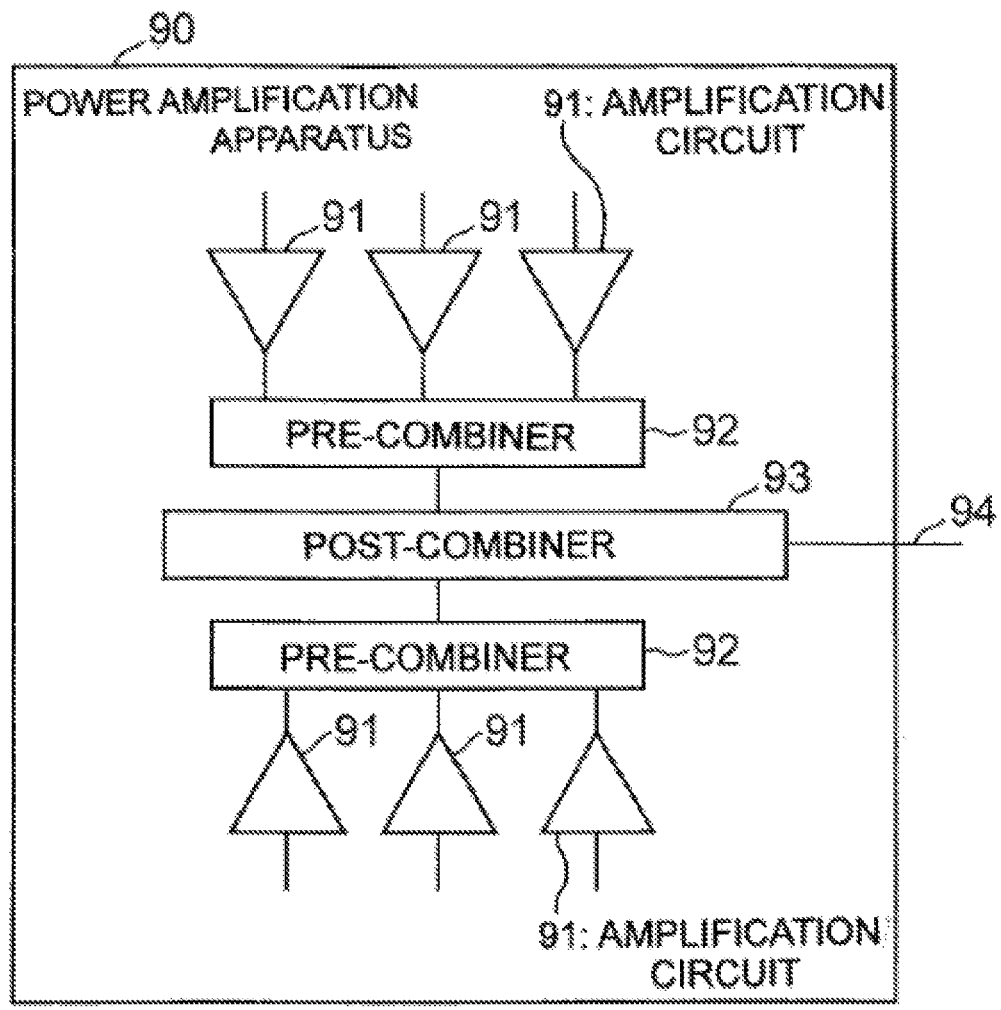
FIG. 17 is a schematic view illustrating an example of the configuration of a common power amplification apparatus.

Next, the outline of the present invention is described. FIG. 16 is a block diagram illustrating the outline of the power amplification apparatus of the present invention. The power amplification apparatus 10 of the present invention has the amplification unit 1 containing at least one set containing a predetermined number of amplification circuits 2 amplifying the power of an RF signal and the combining unit 5 containing the combiner 7 provided corresponding to the set and combining RF signals output by the amplification circuits 2 belonging to the corresponding set, and then outputting the resultant RF signal.

The amplification unit 1 has the output connectors 3 for outputting an RF signal output by the amplification circuit 2 for each amplification circuit. The output connectors 3 are disposed so as to be arranged in the horizontal direction.

The combining unit 5 has the input connector 6 into which an RF signal output from the output connector 3 of the amplification unit 1 is input for each output connector 3. The input connectors are disposed so as to be arranged in the horizontal direction.

The amplification unit 1 and the combining unit 5 are attachable/detachable through the output connectors 3 and the input connectors 6.

The surface on which the input connectors are provided of the combining unit 5 is set within the dimension of the surface on which the output connectors are provided of the amplification unit 1.

Such a configuration enables the separation of the component (amplification unit 1) for power amplification of RF signals and the component (combining unit 5) for combination of RF signals and easy exchange of the component (combining unit 5) for combination of RF signals.

The embodiments described above may be also described as in the following supplementary notes but is not limited thereto.

(Supplementary note 1) A power amplification apparatus according to the present invention has an amplification unit containing at least one set containing a predetermined number of amplification circuits amplifying the power of an RF (Radio Frequency) signal and a combining unit containing a combiner provided corresponding to the set and combining RF signals output by the amplification circuits belonging to the corresponding set, and then outputting the resultant RF signal, in which the amplification unit has an output connector for outputting the RF signal output by the amplification circuit for each amplification circuit, the output connectors are arranged in the horizontal direction, the combining unit has an input connector into which the RF signal output from the output connector of the amplification unit is input for each output connector, the input connectors are arranged in the horizontal direction, the amplification unit and the combining unit are attachable/detachable through the output connectors and the input connectors, and the surface on which the input connectors are provided of the combining unit is set within the dimension of the surface on which the output connectors are provided of the amplification unit.

(Supplementary note 2) In the power amplification apparatus described in Supplementary note 1, the amplification unit contains two or more of the sets containing a predetermined number of the amplification circuits, the combining unit contains two or more of the combiners combining RF signals output by the amplification circuits, and then outputting the resultant RF signal and contains a second combiner combining the RF signals output by the combiners.

(Supplementary note 3) In the power amplification apparatus described in Supplementary note 1 or 2, each input connector is a floating connecter.

(Supplementary note 4) In the power amplification apparatus described in any one of Supplementary notes 1 to 3, each output connector outputs an RF signal output by a corresponding amplification circuit as it is.

(Supplementary note 5) In the power amplification apparatus described in any one of Supplementary notes 1 to 4, each amplification circuit is an FET (Field Effect Transistor).

(Supplementary note 6) In the power amplification apparatus described in any one of Supplementary notes 1 to 5, the combiner in the combining unit combining RF signals output by the amplification circuits, and then outputting the resultant RF signal is a Doherty combiner.

(Supplementary note 7) In the power amplification apparatus described in any one of Supplementary notes 1 to 6, each set of the amplification circuits contains three amplification circuits, one amplification circuit of the three amplification circuits is an amplification circuit which is set so as to operate in Class AB or Class B, the remaining two amplification circuits are amplification circuits which are set so as to operate in Class C, and the combiner in the combining unit combining RF signals output by the amplification circuits, and then outputting the resultant RF signal is the Doherty combiner.

(Supplementary note 8) In the power amplification apparatus described in any one of Supplementary notes 1 to 6, each set of the amplification circuits contains two amplification circuits, one amplification circuit of the two amplification circuits is an amplification circuit which is set so as to operate in Class AB or Class B, the remaining one amplification circuit is an amplification circuit which is set so as to operate in Class C, and the combiner in the combining unit combining RF signals output by the amplification circuits, and then outputting the resultant RF signal is the Doherty combiner.

(Supplementary note 9) A television signal transmission system has the power amplification apparatus described in any one of Supplementary notes 1 to 8.

INDUSTRIAL APPLICABILITY

The present invention is suitably applied to a television signal transmission system or a power amplification apparatus provided in the television signal transmission system.

REFERENCE SIGNS LIST 1 amplification unit
2 amplification circuit
3 output connector
5 combining unit
6 input connector
7 combiner (first combiner)
8 second combiner
10 power amplification apparatus
20 television signal transmission system
21 exciter
22 distributor
23 power combiner
24 filter unit
25 antenna
26 controller

The invention claimed is:

1. A television signal transmission system comprising:
a plurality of power amplification apparatuses,
the plurality of power amplification apparatuses is disposed in a plurality of stages in a vertical direction in a rack,
wherein each power amplification apparatus comprises:
  an amplification unit, containing two or more sets containing a plurality of amplification circuits, that amplifies power of a radio frequency (RF) signal; and
  a combining unit, containing two or more combiners corresponding to the two or more sets, that combines RF signals output by the amplification circuits, and outputs a resultant RF signal,
wherein:
  in each power amplification apparatus, the amplification unit has one chassis storing each amplification circuit,
  in each power amplification apparatus, the amplification unit and the combining unit have two or more connectors which are arranged transversely, and
  in each power amplification apparatus, the amplification unit and the combining unit are attachable/detachable,
wherein the television signal transmission system further comprises:
  an exciter for generating an RF signal to be transmitted as a television signal;
  a distributer that is connected to the amplification unit of each power amplification apparatus for distributing the RF signal output from the exciter to each amplification circuit provided in the amplification unit of each power amplification apparatus;
  an antenna; and
  a power combiner that is connected to the combining unit of each power amplification apparatus for performing power combination of RF signals output from the combining unit of each power amplification apparatus and outputting the RF signal after power combination to the antenna.

2. The television signal transmission system according to claim 1, wherein
in each power amplification apparatus, the combining unit is disposed on a deep side relative to the amplification unit in the rack.

3. The television signal transmission system according to claim 1, wherein
in each power amplification apparatus, the combining unit contains the two or more combiners that combine RF signals output by the amplification circuits, and contains a second combiner that combines RF signals output by the combiners and then outputs the resultant RF signal.

4. The television signal transmission system according to claim 1, wherein
each amplification circuit is a field effect transistor (FET).

5. The television signal transmission system according to claim 1, wherein
in each power amplification apparatus, the two or more combiners in the combining unit that combine RF signals output by the amplification circuits, and then output resultant RF signals are Doherty combiners.

6. The television signal transmission system according to claim 1, wherein
in each power amplification apparatus, each set of the amplification circuits contains three amplification circuits, wherein one amplification circuit of the three amplification circuits is an amplification circuit which is set so as to operate in Class AB or Class B, and two amplification circuits are amplification circuits which are set so as to operate in Class C, and
in each power amplification apparatus, the two or more combiners in the combining unit that combine RF signals output by the amplification circuits, and then output resultant RF signals are Doherty combiners.

7. The television signal transmission system according to claim 1, wherein
in each power amplification apparatus, each set of the amplification circuits contains two amplification circuits, wherein one amplification circuit of the two amplification circuits is an amplification circuit which is set so as to operate in Class AB or Class B, and one amplification circuit is an amplification circuit which is set so as to operate in Class C, and
in each power amplification apparatus, the two or more combiners in the combining unit that combine RF signals output by the amplification circuits, and then output resultant RF signals are Doherty combiners.

* * * * *